United States Patent [19]

Matsuda et al.

[11] Patent Number: 4,957,834
[45] Date of Patent: Sep. 18, 1990

[54] METHOD FOR MANUFACTURING PHOTOMASK

[75] Inventors: Shuichi Matsuda; Yaichiro Watakabe, both of Hyogo, Japan

[73] Assignee: Mitsubishi Denki Kabushiki Kaisha, Tokyo, Japan

[21] Appl. No.: 266,706

[22] Filed: Nov. 3, 1988

[30] Foreign Application Priority Data

Dec. 22, 1987 [JP] Japan .................. 62-324417

[51] Int. Cl.$^5$ ............................. G03F 1/00
[52] U.S. Cl. .......................... 430/5; 430/296; 156/643
[58] Field of Search ............ 430/5, 296, 321; 156/643

[56] References Cited

U.S. PATENT DOCUMENTS 4,411,734 10/1983 Maa ...................... 156/643

FOREIGN PATENT DOCUMENTS 49234 3/1982 Japan .
173251 8/1986 Japan .

Primary Examiner—Jose Dees

[57] ABSTRACT

In manufacturing a photomask, a molybdenum silicide film is formed on the main surface of a quartz substrate. A resist film having a pattern is, then, formed on the molybdenum silicide film. Thereafter, the molybdenum silicide film is etched using the resist film as a mask. The etching is effected in a plasma generated in a mixed gas containing nitrogen gas in $CF_4$ gas.

12 Claims, 10 Drawing Sheets

METHOD FOR MANUFACTURING PHOTOMASK

BACKGROUND OF THE INVENTION

Field of the Invention

The present invention relates to a method for manufacturing a photomask for use in a manufacturing process of a semiconductor device such as a large scale integrated circuit device (LSI).

A fine processing technique is indispensable in manufacturing a highly integrated semiconductor device such as an LSI. A technique for transferring a pattern to a semiconductor substrate is important in the fine processing techniques. Above all, it is important to transfer a pattern to a resist applied to the semiconductor substrate by means of a exposure technique. In the photolithography which plays an important role in the fine processing techniques, a photomask is the basis from which a fine pattern is transferred to the resist. A fine pattern of the photomask is formed on a transparent glass substrate through a substance which intercepts an ultraviolet light.

FIGS. 1A to 1D are partially sectional views showing a conventional method for manufacturing a photomask in order of steps disclosed, for example, in Japanese Patent Laying-Open Gazette No. 173251/1986. The conventional method for manufacturing the photomask is described with reference to FIGS. 1A to 1D.

Referring to FIG. 1A, a metal silicide film 2 having the thickness of approximately 1000 Å is formed on the overall surface of a transparent glass substrate 1 such as a quartz substrate by means of a sputtering or an electron beam deposition using a metal silicide such as molybdenum silicide ($MoSi_x$) or tungsten silicide ($WSi_x$) as a target.

Referring to FIG. 1B, a resist such as PMMA (polymethylmethacrylate) is applied to the metal silicide film 2 in the thickness of 4000 Å to 6000 Å to form a resist film 3. A desired pattern is drawn thereon by ultraviolet lights or electron beams. Thereafter, the resist film 3 having the pattern is developed and baked at temperatures of 100° C. to 140° C.

As shown in FIG. 1C, the metal silicide film 2 is etched using the resist film 3 as a mask.

As shown in FIG. 1D, the resist film 3 is removed so that a photomask pattern is formed in the metal silicide film 2. The photomask thus formed is utilized for manufacturing a semiconductor device.

According to the above-described conventional method for manufacturing a photomask, the step of etching shown in FIG. 1C is that of dry etching, which is performed by a reactive ion etching as a kind of plasma etching using a plane parallel plate type of apparatus. FIG. 2 is a schematic diagram showing an example of apparatus used in the reactive ion etching. Referring to FIG. 2, an anode plate 5a and a cathode plate 5b are provided as plane parallel plates in a chamber 4. The transparent glass substrate 1 on which the metal silicide film 2 and the resist film 3 are formed is placed on the cathode plate 5b. The cathode plate 5b is grounded through an RF power supply 6 having a high frequency.

The step of etching the metal silicide film 2 in a plasma by using the apparatus is described hereinafter. FIGS. 3A and 3B show the process of the plasma etching in accordance with the conventional method for manufacturing the photomask. Referring to FIGS. 2, 3A, and 3B, a sample is placed on the cathode plate 5b.

A gas in the chamber 4 is discharged therefrom in the direction shown by the arrow A shown in FIG. 2 so as to keep the atmosphere in the chamber 4 less than 0.1 Torr. Thereafter, a mixed gas of 95%-$CF_4$ and 5%-$O_2$ is introduced from a gas bomb 7a into the chamber 4 through a regulator 8 and a valve 9. A mass-flow controller 10 keeps the pressure in the chamber 4 constant, for example, approximately 0.2 Torr. An RF discharge occurs in the chamber 4 at the frequency of 13.56 MHz and the output of 300 W to generate a plasma between the anode plate 5a and the cathode plate 5b. The plasma contains a radical substance which is chemically active. Fluorine radical substance $F^*$ is contained in the plasma in this case. The radical substance acts as an etchant for etching the metal silicide film 2. While the metal silicide film 2 is thus etched, a light having a certain wavelength is monitored through a glass 12 and a light receiving portion 11 provided outside the chamber 4 so that the end point of etching is detected by an end point detection unit 13. The switch of the RF power supply 6 is turned off when the end point of the etching is detected. Thereafter, a gas remaining in the chamber 4 is removed therefrom so that the pressure therein is below 0.1 Torr. Nitrogen gas is, then, introduced into the chamber 4 in the direction shown by the arrow B in FIG. 2. As a result, the chamber 4 is maintained at atmospheric pressure. The sample is taken out of the chamber 4. Thus, the metal silicide film 2 formed on the transparent glass substrate 1 is etched.

As described above, a pattern is drawn by the electron beam on the electron beam sensitive resist applied in the thickness of 4000 Å to 6000 Å to the molybdenum silicide film 2. As the sheet resistance of the molybdenum silicide 2 is approximately 100Ω/□, the molybdenum silicide 2 does not cause a charge-up phenomenon that the electron beams are deflected by the electric charge which has remained on the surface of the metal silicide film. Further, the dry etching of the molybdenum silicide film can be more easily effected than that of a chromium film. For example, when the dry etchings of the molybdenum silicide film and the chromium film are performed in the above-described condition, the molybdenum silicide film is etched at the rate of approximately 500 Å to 1000 Å/min, which is approximately 5 to 10 times that of the chromium film. Furthermore, since the metal silicide principally includes silicon, its adhesiveness to the quartz substrate (including $SiO_2$, $Al_2O_3$, and the like) is desirable, so that the metal silicide is not peeled from the quartz substrate. Thus, a photomask can be reliably manufactured.

A photomask thus manufactured is reliable. However, the conventional method has a disadvantage in that dry etching-resistant resists can be only used. Another disadvantage thereof is that positive type resists having resistances to the dry etchings are low in their sensitivities to electron beams, and, therefore, such resists are used at the sacrifice of the throughout of an electron beam exposure device. Further, there occurs a case in which such a resist is not completely removed from the metal silicide, so that a pattern developed on the metal silicide cannot be preferably reproduced.

SUMMARY OF THE INVENTION

The present invention has been made to solve the above-described disadvantage and has for its essential object of the present invention to provide a method for manufacturing a photomask which is capable of using even a resist having a low resistance to a dry etching, and improving the speed at which a metal silicide film is etched, and etching the resist at an appropriate speed.

According to the method for manufacturing a photomask of the present invention, a film of silicide of a refractory metal is formed on the main surface of a transparent glass substrate. A resist film having a pattern is applied to the metal silicide film. Thereafter, the metal silicide film is etched in a plasma using the resist film as a mask. The metal silicide film is etched in the plasma of halogen gas and nitrogen gas.

According to a preferred embodiment, a quartz substrate is used as a transparent glass substrate and $CF_4$ is used as a halogen gas. A molybdenum silicide film is preferred as a metal silicide to be formed on the transparent glass substrate.

According to the present invention, a mixed plasma of a nitrogen gas and a halogen gas has more radical substances, which act as etchants of the metal silicide and are chemically reactive, than a plasma of only a halogen gas. Therefore, the etching speed ratio of the metal silicide to the etching speed of the resist (hereinafter referred to as selection ratio) can be improved.

These objects and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment of the present invention is described hereinafter.

FIGS. 4A to 4D are partially sectional views of an embodiment showing the method for manufacturing a photomask in accordance with the present invention in order of steps.

Figure 4A:
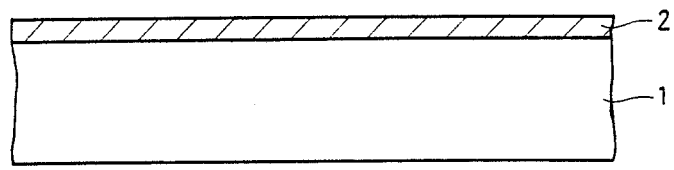
FIGS. 4A, 4B, 4C, and 4D are partially sectional views showing the method for manufacturing a photomask in accordance with the present invention in order of steps.

Referring to FIG. 4A, a metal silicide film 2 having the thickness of approximately 1000 Å is formed on a transparent glass substrate 1 such as a quartz substrate by means of a sputtering or an electron beam deposition using a metal silicide such as molybdenum silicide ($MoSi_x$) and the like as a target in the vacuum.

Figure 4B:
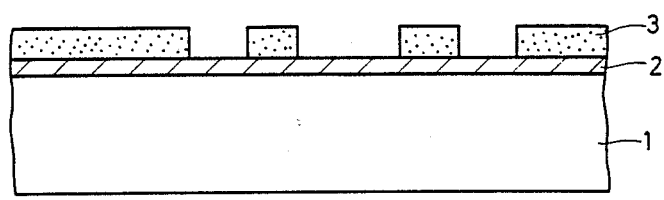

As shown in FIG. 4B, a resist is applied to the metal silicide film 2 in the thickness of approximately 4000 Å to 6000 Å thick. The resist to be used in this embodiment may be a positive type resist such as EBR-9 (trade name) which is etched 4 to 5 times as fast as a negative type resist CMS (chloromethylenestyrene) which has a dry etching-resistance and conventionally used as a negative resist. Thereafter, a desired pattern is drawn on the resist by electron beams to form the resist film 3 having the pattern. The resist film 3 is developed, and thereafter, baked at 100° C. to 140° C.

Figure 4C:
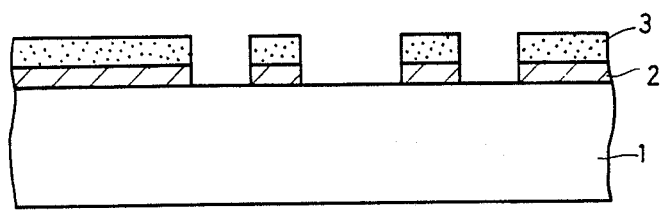

As shown in FIG. 4C, the metal silicide film 2 is etched using the resist film 3 as a mask.

Figure 4D:
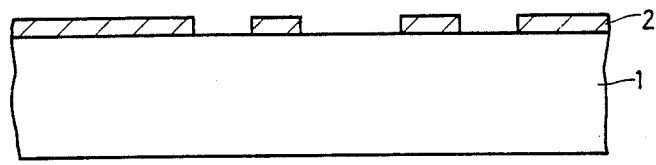

Referring to FIG. 4D, the resist film 3 is removed from the metal silicide film 2 so that a photomask used for manufacturing a semiconductor device is formed.

Figure 1A:
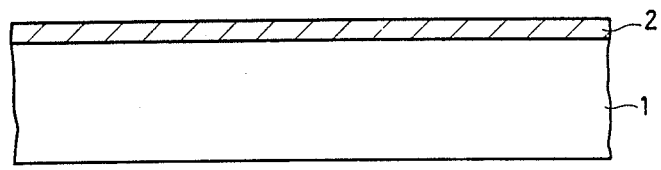
FIGS. 1A, 1B, 1C, and 1D are partially sectional views showing a conventional method for manufacturing a photomask in order of steps.
Figure 1B:
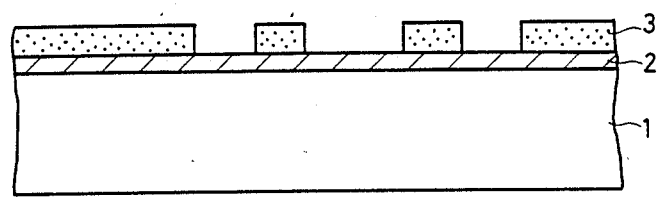
Figure 1C:
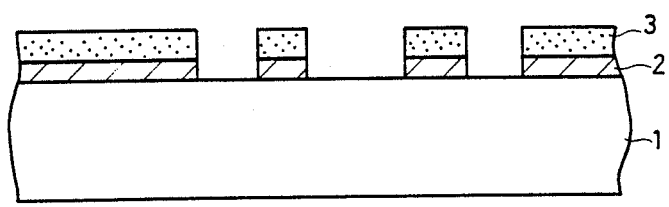
Figure 1D:
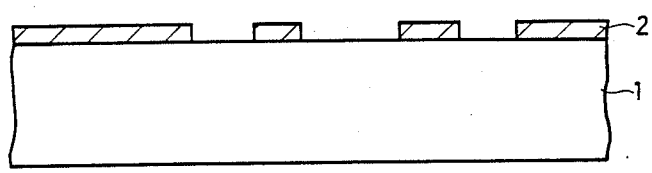
Figure 2:
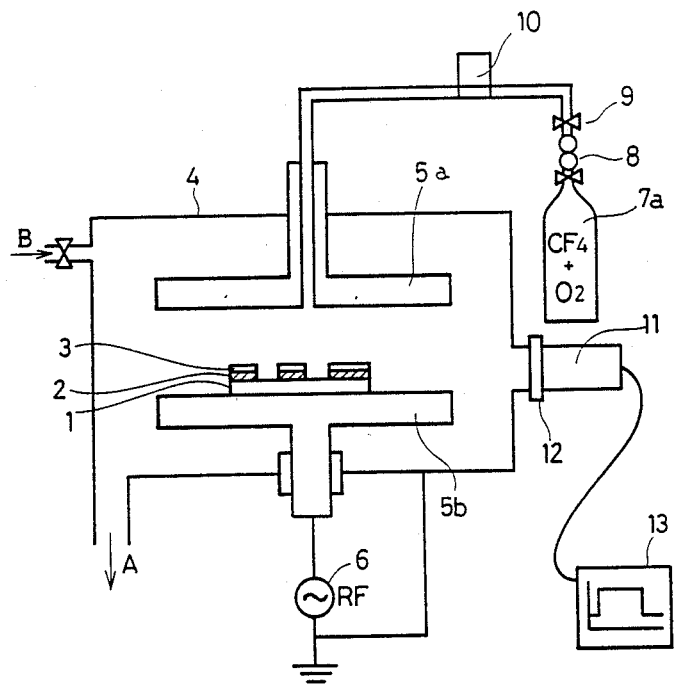
FIG. 2 is a schematic diagram showing a conventional etching apparatus.
Figure 3A:
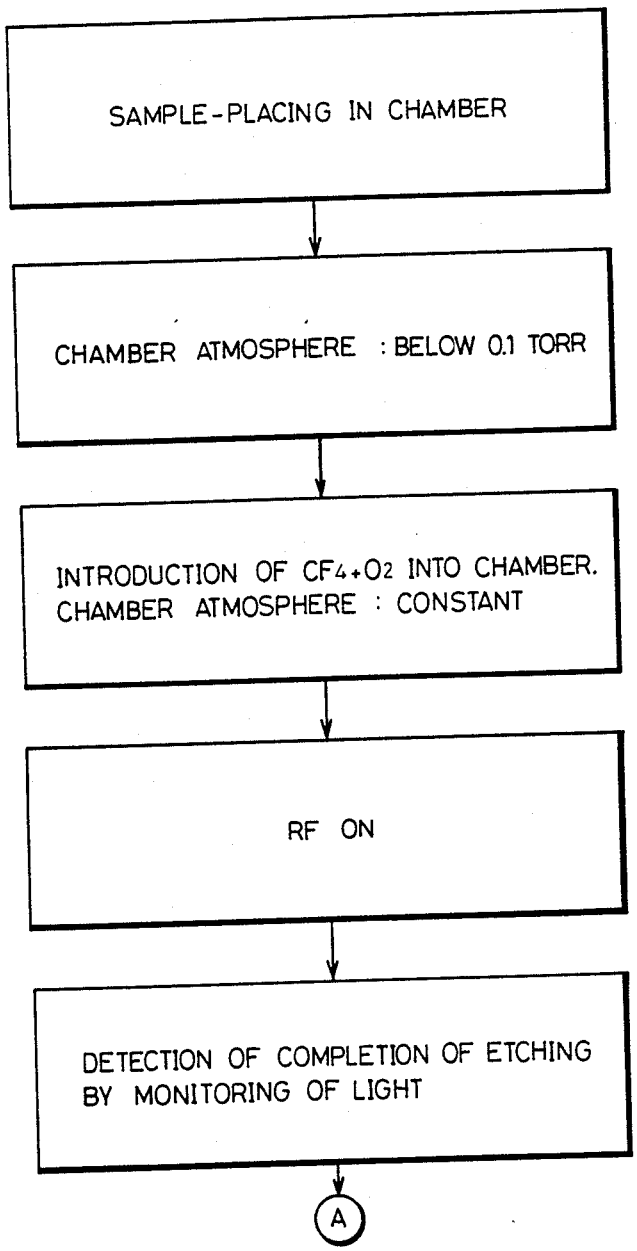
FIGS. 3A and 3B are views showing a conventional etching process.
Figure 3B:
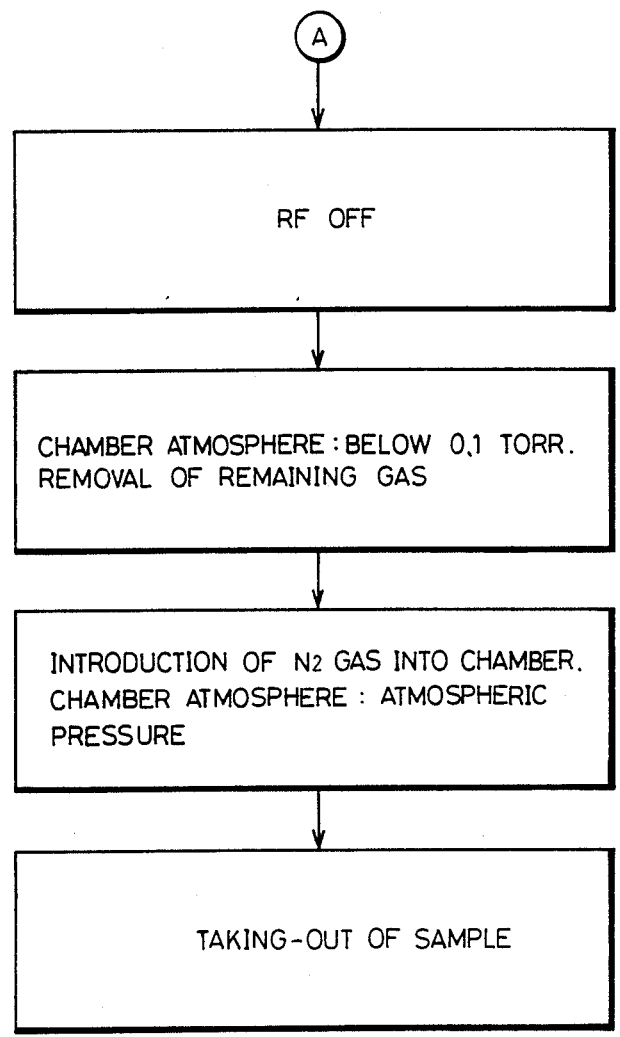
Figure 5:
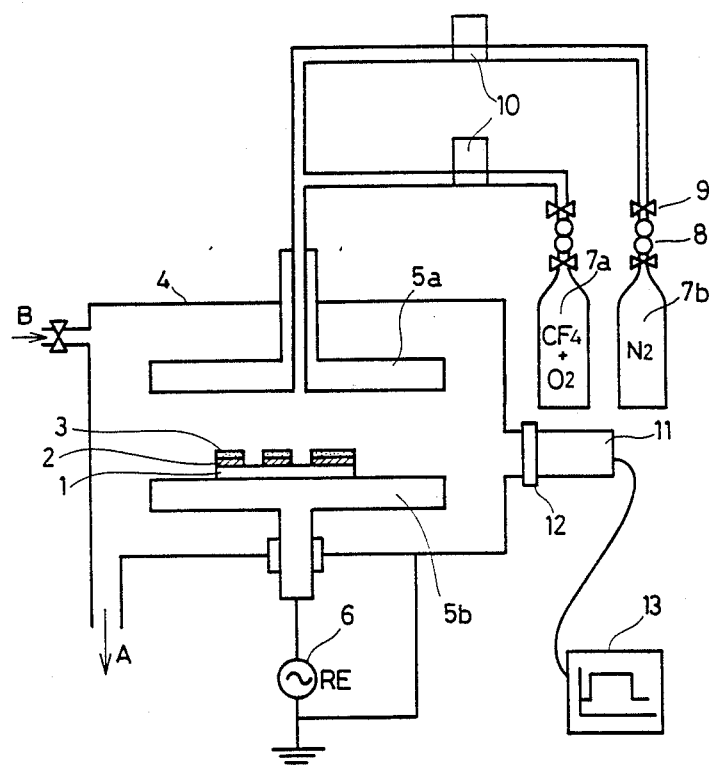
FIG. 5 is a schematic diagram showing an etching apparatus in accordance with the present invention.

The step of etching the metal silicide film 2 shown in FIG. 4C is performed by using the apparatus shown in FIG. 5. The construction of the apparatus shown in FIG. 5 is the same as that shown in FIG. 2 except that the apparatus shown in FIG. 5 is provided with a gas bomb 7b which contains nitrogen gas. Therefore, the description of the apparatus shown in FIG. 5 is omitted herein.

Figure 6A:
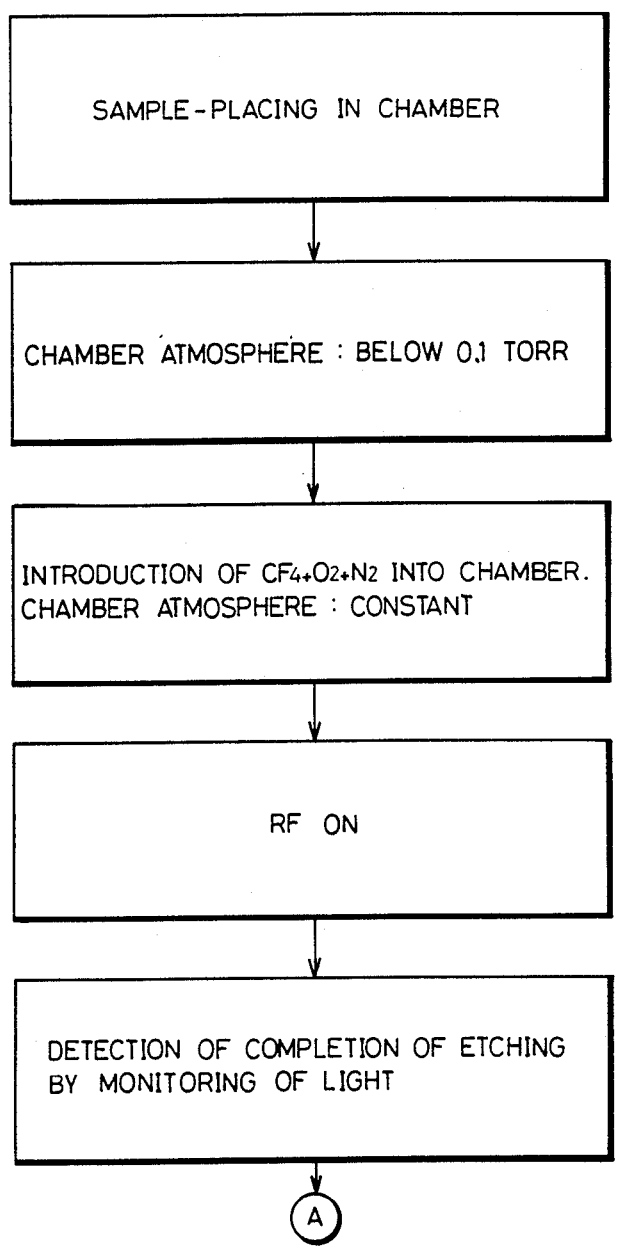
FIGS. 6A and 6B are views showing the etching process in accordance with the present invention.
Figure 6B:
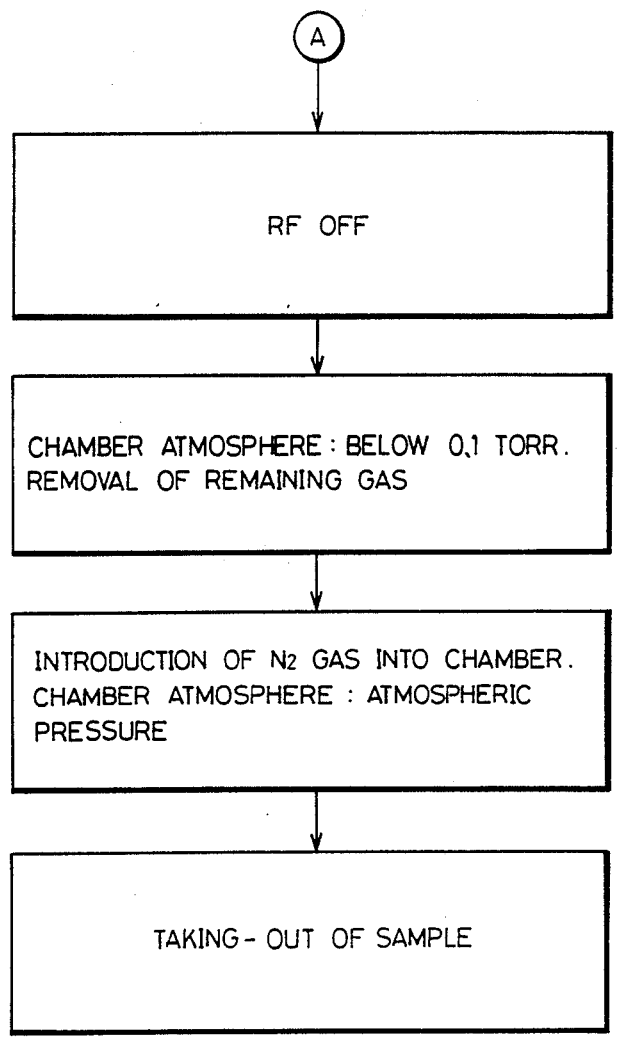

The step of a plasma etching to be performed by the apparatus shown in FIG. 5 is described hereinafter. FIGS. 6A and 6B show the process of the plasma etching to be performed in accordance with the present invention. Referring to FIGS. 5, 6A, and 6B, a sample is placed on the cathode electrode 5b in the chamber 4. A gas in the chamber 4 is discharged therefrom in the direction shown by the arrow A so as to keep the atmosphere in the chamber 4 less than 0.1 Torr. Thereafter, a gas of 90%-$CF_4$ and 5%-$O_2$ contained in the gas bomb 7a, and a gas of 5%-$N_2$ contained in the gas bomb 7b are introduced into the chamber 4 through the regulators 8 and the valves 9. At this time, the mass-flow controller 10 provided with the supply pipes connected to the gas bombs 7a and 7b keeps the pressure in the chamber 4 constant, for example, approximately 0.3 Torr. Thereafter, an RF discharge occurs in the chamber 4 at the frequency of 13.56 MHz and the RF output density of 0.1 to 0.2 W/cm$^2$ to generate a plasma between the anode plate 5a and the cathode plate 5b. Fluorine radical substance F is contained as a chemically active substance in the plasma. The fluorine radical substance F* etches the metal silicide film 2. The flow rate of the halogen gas ($CF_{4+O2}$) is approximately 100 cm$^3$ in the standard condition (amount converted into the amount of nitrogen gas under atmospheric pressure). A gas of 5%-$N_2$ is added to the halogen gas. The emission spectrum intensity of the fluorine radical substance F* acting as etchants is 1.3 times as great as that of the conventional one. Therefore, the etching speed of the metal silicide only increases although the etching speed of the resist is almost the same as that of the conventional one. After the end point of the etching is detected in a manner similar to that to be performed conventionally, the sample is taken out of the chamber 4, and thus the step of etching is completed.

Figure 7:
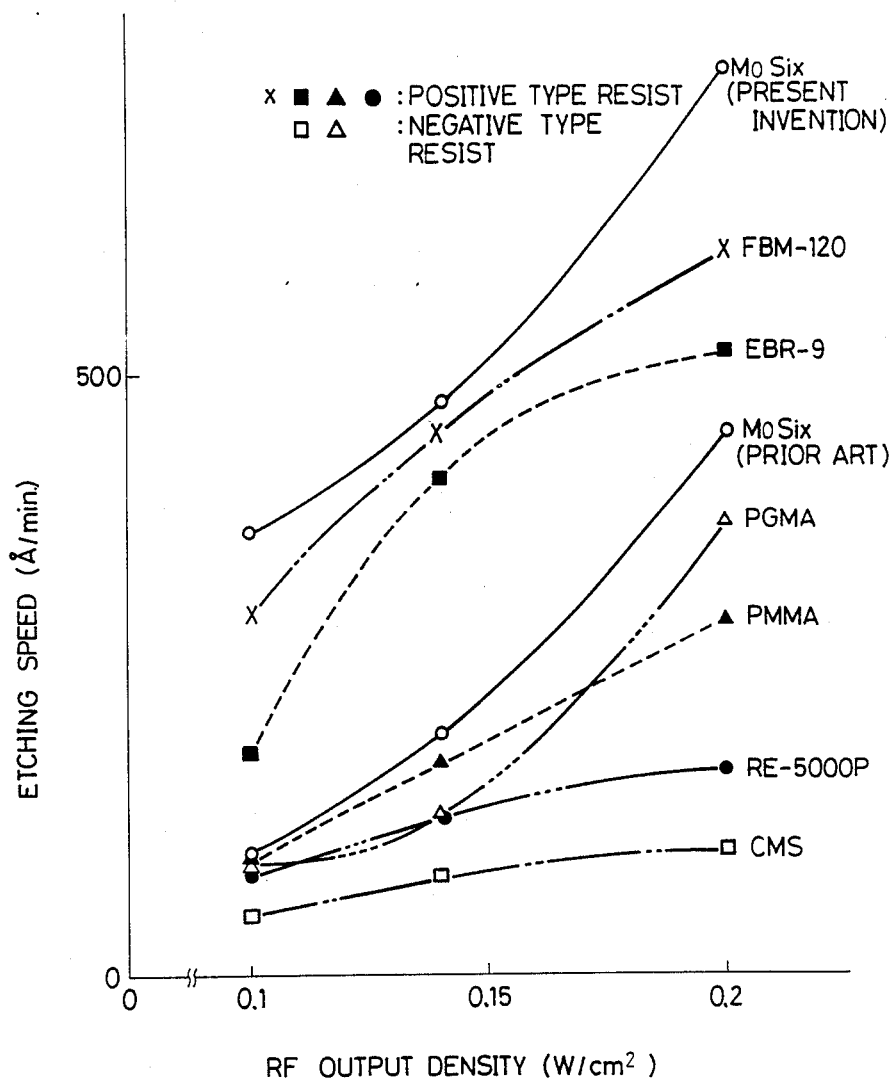
FIG. 7 is a graph showing the relationship between etching speeds and RF output densities in relation to metal silicide films and resists.

According to the present invention, the etching speed of the metal silicide film is faster than that by the conventional method, while the etching speed of the resist film is the same as that of the conventional one. FIG. 7 shows the comparison of the etching speed of the metal silicide film in accordance with the present invention with that of the metal silicide film by the conventional method, in addition to the etching speeds of several kinds of resists. In the figure, the relation between the etching speed and the RF output density is shown. The condition under which the metal silicide and the resist are etched is the same as that of the above-described embodiment of the present invention except for the RF output density. Referring to FIG. 7, FBM-120, EBR-9, PMMA (polymethylmethacrylate), and RE-5000P are positive type resists. PGMA (polyglycidylmethacrylate) and CMS (chloromethyl styrene) are negative type resists. FBM-120, EBR-9, and RE-5000P are trade names. As apparent from FIG. 7, in the step of etching in accordance with the present invention, the molybdenum silicide film used as the metal silicide film is etched much faster than the conventional one. Since the molybdenum silicide film is etched very fast by the method of the present invention, it is possible to use resists which have not been used because of their susceptibility to a dry etching. The resists include, for example, FBM-120, EBR-9, and the like. In other words, the number of kinds of resists which can be used in the step of etching increases.

Figure 8:
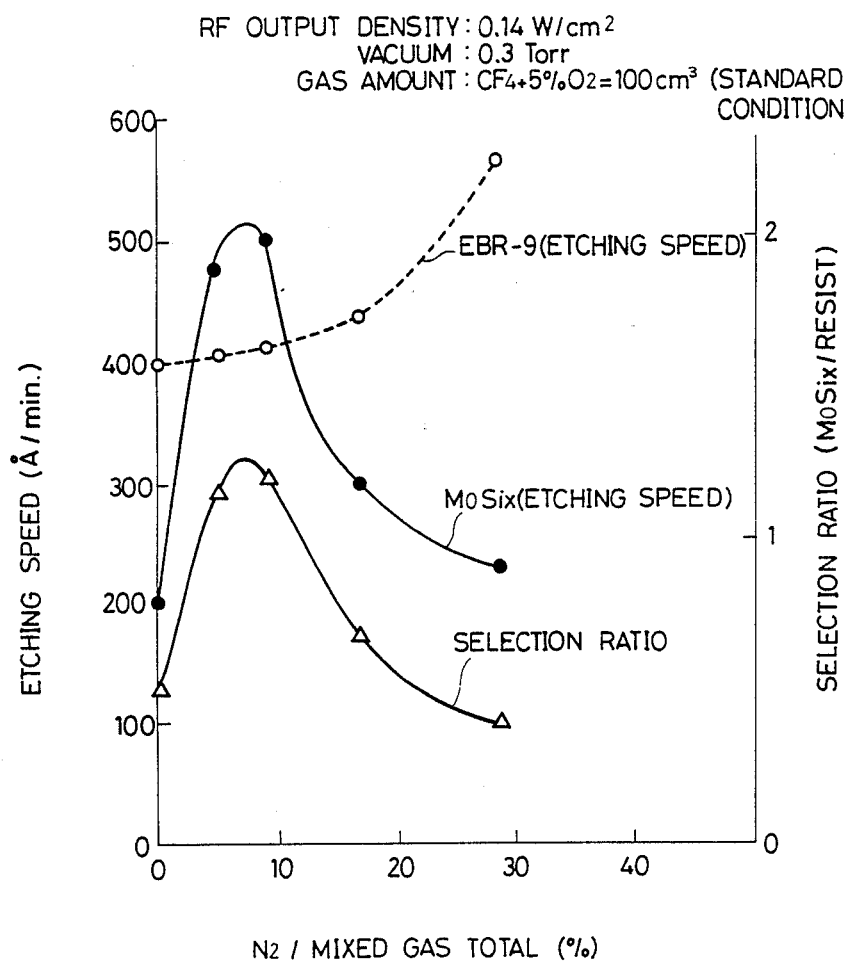
FIG. 8 is graph showing the relationship between etching speeds and ratios of nitrogen gas contained in a mixed gas in relation to a resist and a metal silicide film.

FIG. 8 shows the relationship between the etching speeds of the resist EBR-9 and the molybdenum silicide film, and the ratio (%) of nitrogen gas to a mixed gas including $CF_4 + 5\%$ $O_2$ gas, whose volume is 100 cm$^3$ (amount which is converted into that of the standard condition). The resist EBR-9 and the molybdenum silicide film are etched at the RF output density of 0.14 W/cm$^2$ in the vacuum of 0.3 Torr. When nitrogen gas is mixed with the halogen gas at 4 to 12%, the molybdenum silicide is etched faster than the resist, i.e., the selection ratio is greater than 1. In this case, the molybdenum silicide is preferably etched.

$CF_4$, which is a fluorine group gas, is used as a halogen gas in the above-described embodiment. However, other fluorine group gas such as $SF_6$ and the like, and chlorine group gas such as $CCl_4$, $SiCl_4$, and the like may be used. The metal silicide film to be used in the present invention is not limited to a molybdenum silicide film. Metal silicide films may be films of silicide of at least a refractory metal such as tantalum (Ta), tungsten (W), and the like.

In the above-described embodiment, the resist and the metal silicide are etched by varying the percentage of nitrogen gas to be mixed in the gas of $CF_4 + (5\%)O_2$. However, depending on a metal silicide and a resist, a preferable selection ratio can be accomplished by appropriately varying the mixture ratio of oxygen gas and nitrogen gas.

According to the present invention, since nitrogen gas is mixed in a halogen gas conventionally used to generate a plasma, the plasma increases only the etching speed of the metal silicide film without changing the etching speed of the resist. Therefore, resists susceptible to a dry etching can be used, and thus the selection range of resists becomes widened. The selection ratio is improved in the step of etching, so that etchings are efficiently carried out. Thus, a photomask can be manufactured reliably and with a high accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a photomask, comprising
    providing a transparent glass substrate, said substrate being provided with a main surface;
    forming on the main surface of the substrate a refractory metal silicide film, said silicide film having a main surface opposite the side where the silicide film contacts the main surface of the substrate;
    forming resistant films on the main surface of the silicide film, said resistant films being formed at a predetermined distance from one another to expose portions of the main surface of the silicide film; and
    plasma etching the exposed portions of the main surface of the metal silicide film in a gas mixture containing at least nitrogen gas and $CF_4$ gas.

2. A method for manufacturing a photomask in accordance with claim 1, wherein said nitrogen gas is contained in the gas mixture at 4 to 12%.

3. A method for manufacturing a photomask in accordance with claim 2, wherein said metal silicide film comprises a molybdenum silicide film.

4. A method for manufacturing a photomask in accordance with claim 3, wherein the step of forming said resist films comprises the steps of applying an electron beam sensitive resist to said film of silicide and drawing a mask pattern on said resist film by an electron beam.

5. A method of manufacturing a photomask, comprising
    providing a transparent glass substrate with a main surface;
    forming a refractory metal silicide film on the main surface of the substrate, the thus formed film being provided with a main surface opposite the side where the silicide film contacts the main surface of the substrate;
    forming resistant films on the main surface of the silicide film, the resistant films being formed at a predetermined distance from one another to expose portions of the main surface of the metal silicide film; and
    plasma etching the exposed portions of the main surface of the metal silicide film in a gas mixture containing at least nitrogen ga and a halogen-containing gas comprising $CF^4$, the nitrogen gas and the halogen-containing gas being present in proportions and the RF discharge occurring at a frequency and with an output density effective to etch the metal silicide film at a speed higher than the resistant films.

6. The method of claim 5, wherein the gas mixture utilized in the plasma etching step, further comprises oxygen gas.

7. The method of claim 6, wherein
    the plasma etching step is conducted in a gas mixture containing the nitrogen gas, oxygen gas and the halogen-containing gas; the nitrogen gas, the oxygen gas and the halogen-containing gas being present in proportions and the RF discharge occurring at a frequency and with an output density effective to etch the metal silicide film at a faster rate than the resistant films.

8. The method of claim 5, wherein
    the glass substrate comprises a quartz substrate.

9. The method of claim 5, wherein
    the gas mixture utilized in the plasma etching step comprises 4 to 12% of nitrogen gas.

10. The method of claim 5, wherein
    the metal silicide film formed on the main surface of the substrate comprises a molybdenum silicide film.

11. The method of claim 5, wherein the resistant films-forming step comprises
    applying an electron beam-sensitive resist to the main surface of the silicide film; and
    drawing a mask pattern on the resist film with an electron beam.

12. The method of claim 5, wherein
    in the plasma etching step the RF discharge occurs with an output density of 0.1 to 0.2 W/cm$^2$.

* * * * *